US005455632A

United States Patent [19]
Ichihara

[11] Patent Number: 5,455,632
[45] Date of Patent: Oct. 3, 1995

[54] TELEVISION SIGNAL PROCESSING CIRCUIT FOR SIMULTANEOUSLY DISPLAYING A SUB-PICTURE IN A MAIN-PICTURE

[75] Inventor: Kiyoshi Ichihara, Saitama, Japan

[73] Assignee: Kabushiki Kaisha Toshiba, Kawasaki, Japan

[21] Appl. No.: 71,017

[22] Filed: Jun. 2, 1993

[30] Foreign Application Priority Data

Jun. 2, 1992 [JP] Japan ............................. 4-141492

[51] Int. Cl.$^6$ ................................. H04N 5/445
[52] U.S. Cl. ............................. 348/565; 348/568
[58] Field of Search ................... 358/22 PIP, 183, 358/140, 230, 160, 142, 141; 348/555–558, 565–568; H04N 5/45, 5/445

[56] References Cited

U.S. PATENT DOCUMENTS

| | | | |
|---|---|---|---|
| 4,761,688 | 8/1988 | Hakamada | 358/22 PIP |
| 4,953,025 | 8/1990 | Saitoh et al. | 358/230 X |
| 5,065,243 | 11/1991 | Katagiri | 358/183 |

FOREIGN PATENT DOCUMENTS

| | | |
|---|---|---|
| 4137210 | 5/1992 | Germany . |
| 9119378 | 12/1991 | WIPO . |
| 9119384 | 12/1991 | WIPO . |

OTHER PUBLICATIONS

Tsuchida et al, "Multi–Picture System for High Resolution Wide Aspect Ratio Screen", IEEE Transactions on Consumer Electronics, vol. 37, No. 3, Aug. 1991, New York, pp. 313–318.

*Primary Examiner*—Victor R. Kostak
*Attorney, Agent, or Firm*—Cushman Darby & Cushman

[57] ABSTRACT

A television signal processing circuit that includes a display device having a screen with an aspect ratio of m1:n1 (m1<n1), a circuit for displaying a main-picture originated from a first television signal on the display device, a processor for superimposing a sub-picture originated from a second television signal with a reduced size smaller than the main-picture on a part of the main-picture by thinning out the scanning lines of the second television signals, a selector for selecting the display mode of the main-picture between a normal display mode associated with a first number of scanning lines and a zoom display mode associated with a second number of scanning lines less than the first number of scanning lines as well as an expanded vertical amplitude, and a thinning-out processor responsive to the selecting means for thinning out the scanning lines of the sub-picture, either to display the sub-picture at an aspect-ratio of m2:n2 (m2<n2) by thinning out the scanning lines of the sub-picture to 1/a1 when the main-picture is associated with the normal display mode or to display the sub-picture with an aspect-ratio close to the aspect-ratio of m2:n2 by thinning out the scanning lines to 1/a2 (a1<a2) when the main-picture is associated with the zoom display mode.

8 Claims, 8 Drawing Sheets

100% Circularity
Main picture: Normal mode
Sub-picture: Squeeze mode

Long ellipse      25% Blank (total)
Main picture: Normal mode
Sub-picture: Letter-box mode Height ellipse
Main picture: Zoom mode
Sub-picture: Squeeze mode 100% Circularity  25% Blank (total)
Main Picture: Zoom mode
Sub-picture: Letter-box mode

FIG. 3(a) Squeeze mode

FIG. 3(b) Letter-box mode

Main picture : Normal mode
Sub picture : Squeeze mode

FIG. 7(b)

Main picture : Zoom mode
Sub picture : Squeeze mode

FIG. 7(c)

Main picture : Normal mode
Sub picture : Letter-box mode

FIG. 7(d)

Main picture : Zoom mode
Sub picture : Letter-box mode

TELEVISION SIGNAL PROCESSING CIRCUIT FOR SIMULTANEOUSLY DISPLAYING A SUB-PICTURE IN A MAIN-PICTURE

FIELD OF THE INVENTION

The present invention relates generally to a television signal processing circuit, and more particularly, to a television signal processing circuit for simultaneously displaying a sub-picture in a main-picture on a wide aspect-ratio display screen.

BACKGROUND OF THE INVENTION

The NTSC television system is used in many countries, such as the United States, Japan, etc. Furthermore, a number of wide-aspect high definition television broadcasting systems are currently planned to start. In these systems a high definition television (hereinafter referred to as HDTV) broadcasting system and a second generation EDTV (Extended Definition Television) broadcasting system have aspect-ratios wider than that of the existing NTSC television receivers. However they are different from each other.

To comply with the Hi-Vision system broadcasting (16:9 aspect-ratio, 1125 scanning lines) which is a type of the HDTV broadcasting system carried out in Japan, a simplified type of wide aspect screen television receivers equipping a MUSE-NTSC converter inside or outside thereof for performing the sequential scanning of 525 scanning lines at the 16:9 aspect-ratio has appeared. Moreover, there exists a second generation EDTV broadcasting which is also available to receive such a wide aspect-ratio broadcasting signal by implementing the sequential scanning of 525 scanning lines at the 16:9 aspect-ratio.

Among the wide aspect-ratio television receivers which equip a display device, e.g., a cathode ray tube (hereinafter referred to as CRT) with the 16:9 aspect-ratio and are capable of sequential scanning 525 scanning lines; a television receiver which is capable of displaying a picture on a screen of the 16:9 aspect-ratio by switching between a normal mode for fully scanning the 525 scanning lines and a zoom mode for reduced scanning lines, i.e., ¾ (about 75%) of 525 scanning lines by expanding the vertical picture amplitude; has been developed.

Figure 1A:
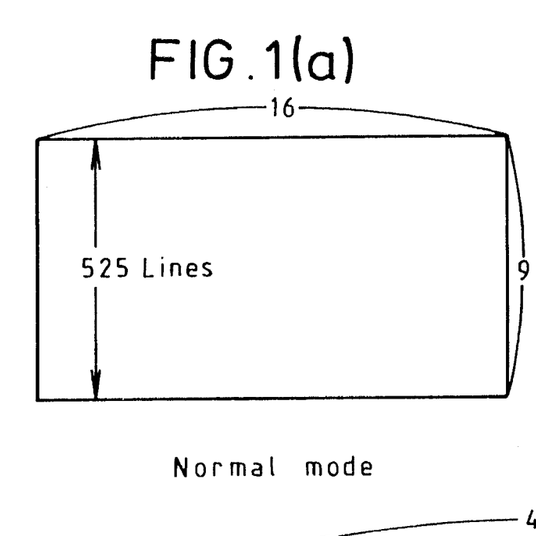
Figure 1B:
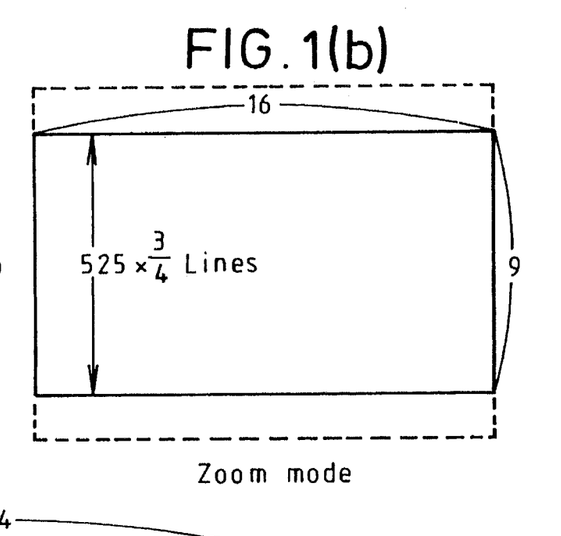

FIG. 1(a) shows the normal mode in which 525 scanning lines are displayed on a CRT with the 16:9 aspect-ratio, while FIG. 1(b) shows the zoom mode in which 525×(¾) scanning lines ape displayed on the same CRT.

Figure 2:
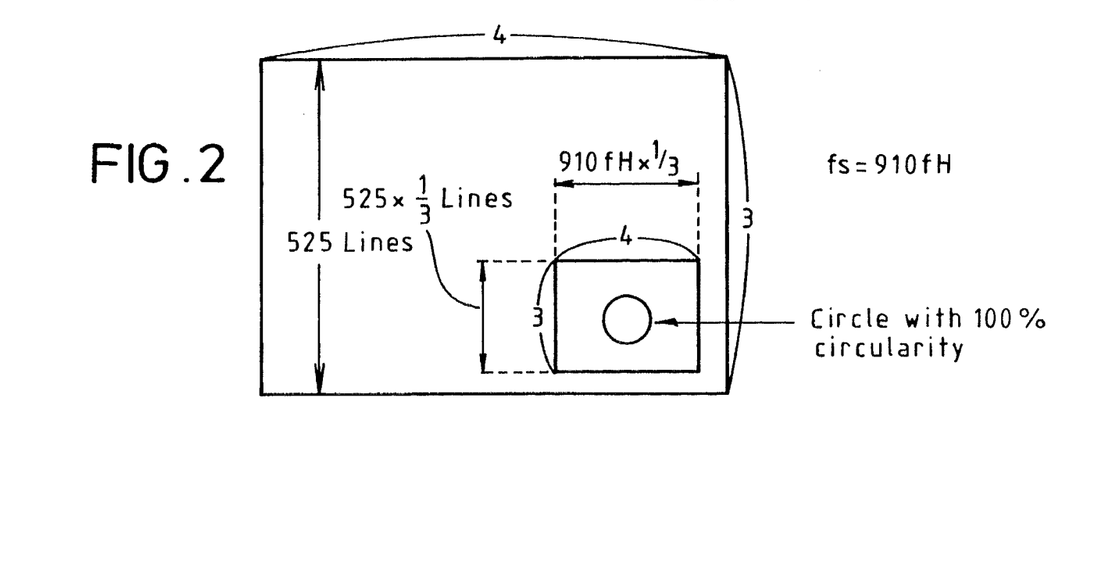
FIG. 2 is a diagram showing the main-picture/sub-picture displays in a television receiver with a conventional 4:3 aspect-ratio CRT.

On such a wide aspect-ratio television receiver which is capable of switching between the normal mode and the zoom mode, it is considered to display a sub-picture in the PIP (Picture In Picture) display system in which horizontal and vertical direction thinning-out ratios are equal (for example, both horizontal and vertical direction thinning-out ratios are ⅓). This PIP technique has been adopted on a television receiver equipped with a 4:3 aspect-ratio CRT. FIG. 2 shows the PIP display mode on an television receiver equipped with a conventional 4:3 aspect-ratio CRT. FIG. 2 further shows the case in which the sub-picture horizontal sampling frequency fs is taken as fs=910 fH (where fH is horizontal scanning frequency of the main-picture), and the horizontal picture amplitude of the sub-picture is taken as (910 fH)×(⅓) and its vertical picture amplitude as 525×(⅓).

Figure 3A:
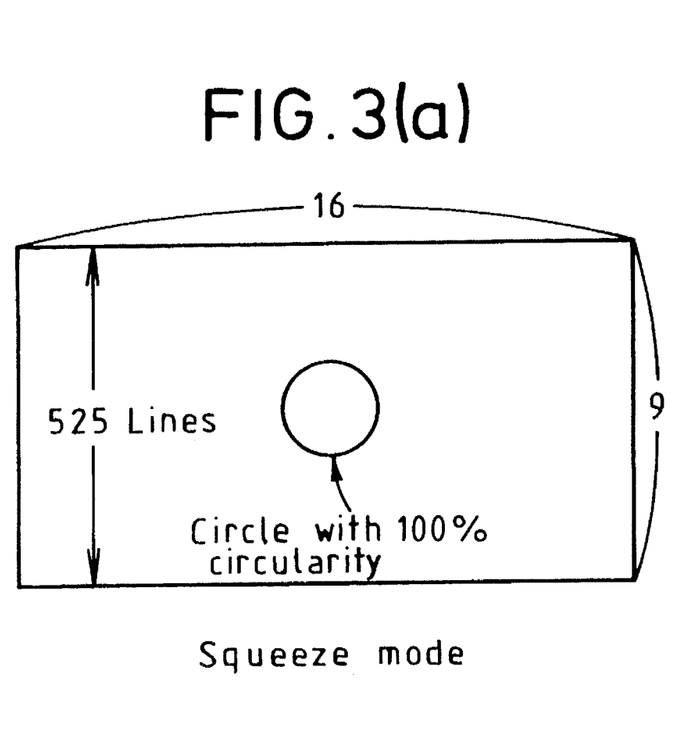

Here suppose a case where the output of an MUSE-NTSC converter which converts MUSE signals into the NTSC signals is used as input signals for the PIP mode sub-picture. Then, following two modes (1) and (2) are considered as the output of the MUSE-NTSC converter, 1) A first specific mode in which it is possible to display a picture with 100% circularity when 525 scanning lines are displayed on a television receiver with a 16:9 aspect-ratio CRT. This mode is called the squeeze mode and is shown in FIG. 3(a).

Figure 3B:
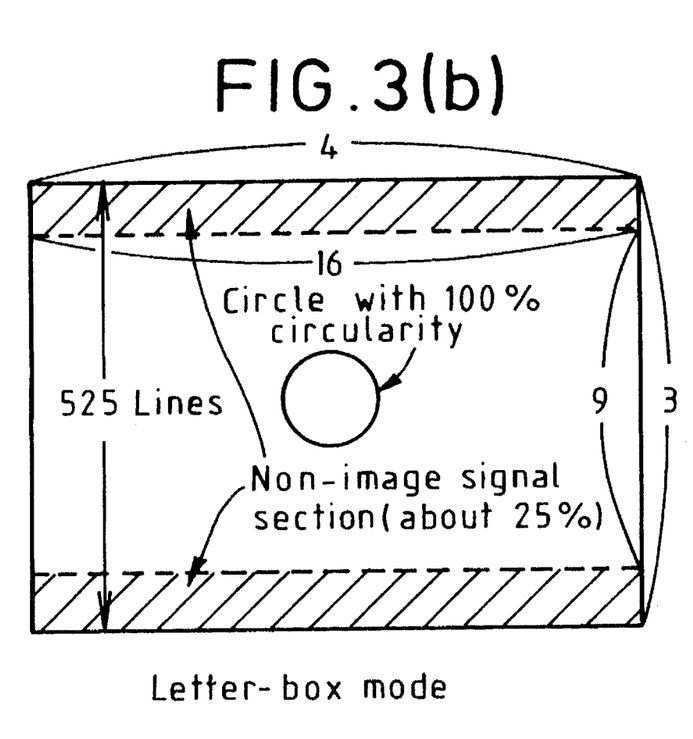

2) A second specific mode in which it is possible to display a picture with 100% circularity, having a blank space of ¼ (about 15%) of 525 scanning lines at the upper and the bottom sections when 525 scanning lines are displayed on a television receiver equipped with a 4:3 aspect-ratio CRT. This mode is called as a letter-box mode and is shown in FIG. 3(b).

When the normal mode or the zoom mode is used for the displaying a main-picture, while the squeeze mode or the letter-box mode is used for displaying a sub-picture, the following four patterns as shown in FIGS. 4(a) through 4(d) can be considered.

Figure 4A:
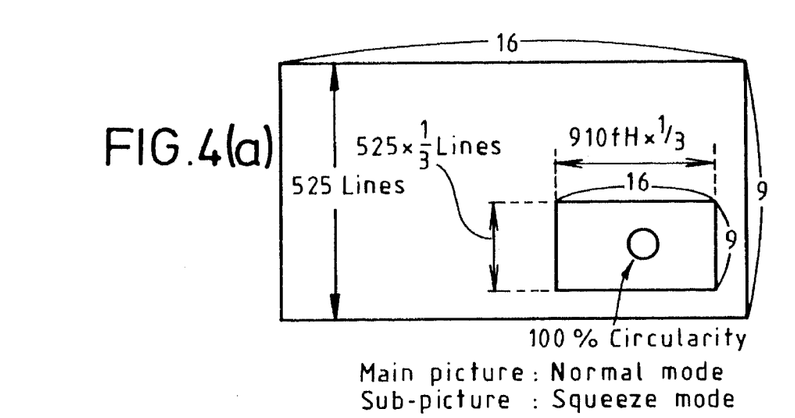
Figure 4B:
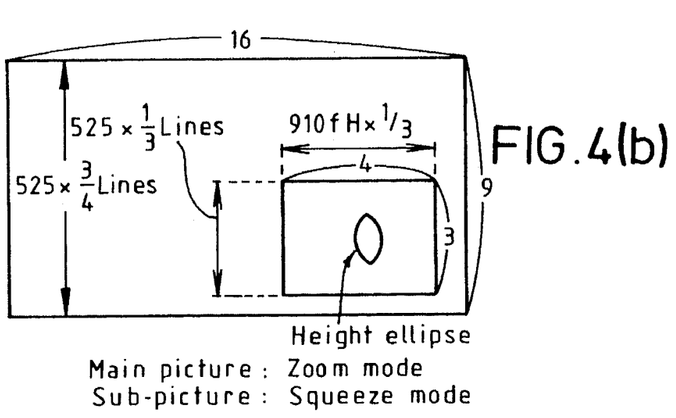
Figure 4C:
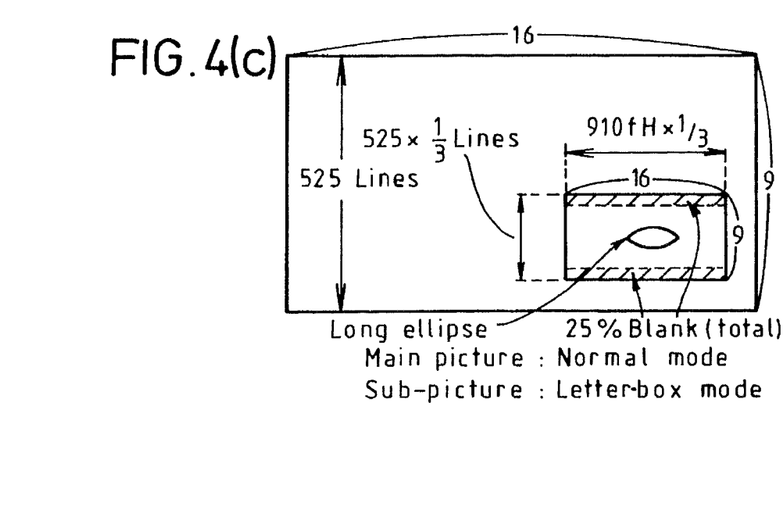
Figure 4D:
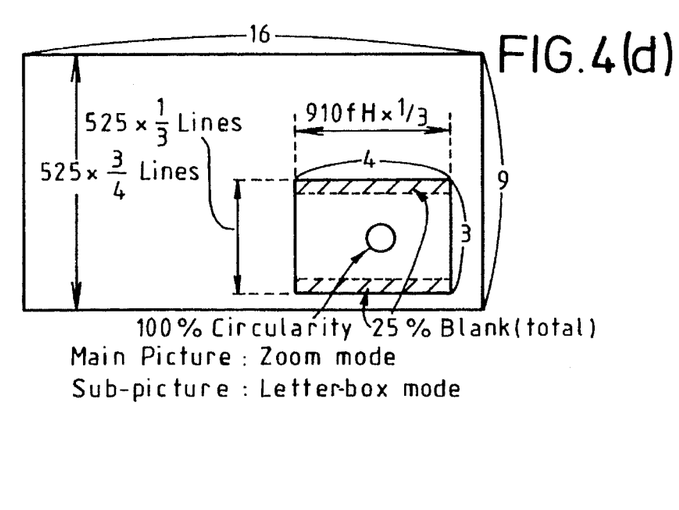

FIG. 4(a) shows a case where the main-picture is displayed in the normal mode and the sub-picture is displayed in the squeeze mode. FIG. 4(b) shows a case where the main-picture is displayed in the zoom mode and the sub-picture is displayed in the squeeze mode, FIG. 4(c) shows a case where the main-picture is displayed in the normal mode and the sub-picture is displayed in the letter-box mode, and FIG. 4(d) shows a case where the main-picture is displayed in the zoom mode and the sub-picture is displayed in the letter-box mode.

In any combination of these modes for displaying the main-picture and the sub-picture, even if it is tried to superimpose the sub-picture on the main-picture, both of them are in the same 16:9 aspect-ratio, the same 100% circularity and the same size, it will be impossible on a conventional PIP mode with the equal horizontal and vertical direction thinning-out ratios. That is, the sub-picture of a circle as shown in FIG. 4(a) will have its shape deformed into a circuilarity corresponding to the 16:9 aspect-ratio, like a vertically long ellipse of the 4:3 aspect-ratio as shown in FIG. 4(b), a horizontally long ellipse of the 16:9 aspect-ratio as shown in FIG. 4(c), and a circle of the 4:3 aspect-ratio and the 100% circularity in FIG. 4(d). Even in the same main-picture mode, a sub-picture in different aspect-ratio, circularity and size is displayed as shown in FIGS. 4(a) and 4((c), and FIGS. 4(b) and 74d) depending upon a sub-picture mode. Consequently the result will be an unsightly sub-picture.

As described above, in a conventional PIP mode of the equal horizontal and vertical direction thinning-out ratios, there is the problem that in any combination of the main-picture mode and the sub-picture mode, it is impossible to display a sub-picture in the same size as the main-picture with the 16:9 aspect-ratio and 100% circularity, so that there is the drawback of unsightliness.

SUMMARY OF THE INVENTION

It is, therefore, an object of the present invention to provide a Television signal processing circuit for simultaneously displaying a sub-picture in a main-picture on a wide aspect-ratio display screen.

In order to achieve the above object, a television signal processing circuit according to the first aspect of the present invention includes a display device having a screen with an aspect ratio of m1:n1 (m1<n1), a circuit for displaying a main-picture originated from a first television signal on the display device, a processor for superimposing a sub-picture originated from a second television signal with a reduced size smaller than the main-picture on a part of the main-picture by thinning out the scanning lines of the second television signals, a selector for selecting the display mode of the main-picture between a normal display mode associated with a first number of scanning lines and a zoom display mode associated with a second number of scanning lines less than the first number of scanning lines as well as an expanded vertical amplitude, and a thinning-out processor responsive to the selector for thinning out the scanning lines of the sub-picture, either to display the sub-picture at an aspect-ratio of m2:n2 (m2<n2) by thinning out the scanning lines of the sub-picture to 1/a1 when the main-picture is associated with the normal display mode or to display the sub-picture with an aspect-ratio closed to the aspect-ratio of m2:n2 by thinning out the scanning lines to 1/a2 (a1<a2) when the main-picture is associated with the zoom display mode.

A television signal processing circuit according to the second aspect of the present invention includes a display device having a screen with an aspect ratio of m1:n1 (m1<n1), a processor for displaying a main-picture originated from a first television signal on the display device, a processor for superimposing a sub-picture originated from a second television signal with an aspect-ratio of m2:n2 (m2<n2, m1/n1<m2/n2) at a reduced size smaller than the main-picture on a part of the main-picture by thinning out the scanning lines of the second television signals, wherein the sub-picture is comprised of an image signal section with an aspect-ratio of m1:n1, a first and a second non-image signal sections adjacent to the top and the bottom of the image signal section, respectively, and a selector for selecting the display mode of the main-picture between a normal display mode associated with a first number of scanning lines and a zoom display mode associated with a second number of scanning lines less than the first number of scanning lines as well as an expanded vertical amplitude, and a thinning-out processor responsive to the selector for thinning out the scanning lines of the sub-picture, either to display the sub-picture with an aspect-ratio close to the aspect-ratio of m1:n1 by thinning out the scanning lines of the sub-picture to 1/a1 and by eliminating the first and the second non-image signal section when the main-picture is associated with the normal display mode or to display the sub-picture with an aspect-ratio close to the aspect-ratio of m1:n1 by thinning out the scanning lines of the sub-picture to 1/a2 (a2>a1) and also by eliminating the first and the second non-image signal section when the main-picture is associated with the zoom display mode.

A television signal processing circuit according to the third aspect of the present invention includes a display device having a screen with an aspect ratio of m1:n1 (m1<n1), a processor for displaying a main-picture originated from a first television signal on the display device, a processor for superimposing a sub-picture originated from a second television signal with an aspect-ratio of m2:n2 (m2<n2, m1/n1<m2/n2) at a reduced size smaller than the main-picture on a part of the main-picture by thinning out the scanning lines of the second television signals, wherein the sub-picture is comprised of an image signal section with an aspect-ratio of m1:n1, a first and a second non-image signal sections adjacent to the top and the bottom of the image signal section, respectively, and a thinning-out processor for thinning out the scanning lines of the sub-picture, either to display the sub-picture with an aspect-ratio close to the aspect-ratio of m1:n1 by thinning out the scanning lines of the sub-picture to 1/a1 and by eliminating the first and the second non-image signal section when the main-picture has the aspect-ratio of m1:n1.

A television signal processing circuit according to the third aspect of the present invention includes a display device having a screen with an aspect ratio of m1:n1 (m1<n1), a processor for displaying a main-picture originated from a first television signal on the display device, a processor for superimposing a sub-picture originated from a second television signal with an aspect-ratio of m2:n2 (m2<n2, m1/n1<m2/n2) at a reduced size smaller than the main-picture on a part of the main-picture by thinning out the scanning lines of the second television signals, wherein the sub-picture is comprised of an image signal section with an aspect-ratio of m1:n1, a first and a second non-image signal sections adjacent to the top and the bottom of the image signal section, respectively, a selector for selecting the display mode of the main-picture between a normal display mode associated with a first number of scanning lines and a zoom display mode associated with a second number of scanning lines less than the first number of scanning lines as well as an expanded vertical amplitude, and a thinning-out processor responsive to the selector for thinning out the scanning lines of the sub-picture, either to display the sub-picture with an aspect-ratio close to the aspect-ratio of m1:n1 by thinning out the scanning lines of the sub-picture to 1/a1 and by eliminating the first and the second non-image signal section when the main-picture is associated with the zoom display mode.

Additional objects and advantages of the present invention will be apparent to persons skilled in the art from a study of the following description and the accompanying drawings, which are hereby incorporated in and constitute a part of this specification.

BRIEF DESCRIPTION OF THE DRAWINGS

A more complete appreciation of the present invention and many of the attendant advantages thereof will be readily obtained as the same becomes better understood by reference to the following detailed description when considered in connection with the accompanying drawings, wherein:

FIGS. 1(*a*) and 1(*b*) are diagrams showing the normal mode and the zoom mode, respectively;

FIGS. 3(*a*) and 3(*b*) are diagrams showing the squeeze mode and the letter-box mode, respectively;

FIGS. 4(*a*) through 4(*d*) are diagrams for illustrating shortcomings of conventional main-picture/sub-picture displays;

FIGS. 7(*a*) through 7(*d*) are diagrams illustrating the four modes of the embodiment in FIGS. 5 and 6.

DESCRIPTION OF THE PREFERRED EMBODIMENTS

The present invention will be described in detail with reference to the FIGS. 5 through 7. Throughout the drawings, like or equivalent reference numerals or letters will be used to designate like or equivalent elements for simplicity of explanation.

Figure 5:
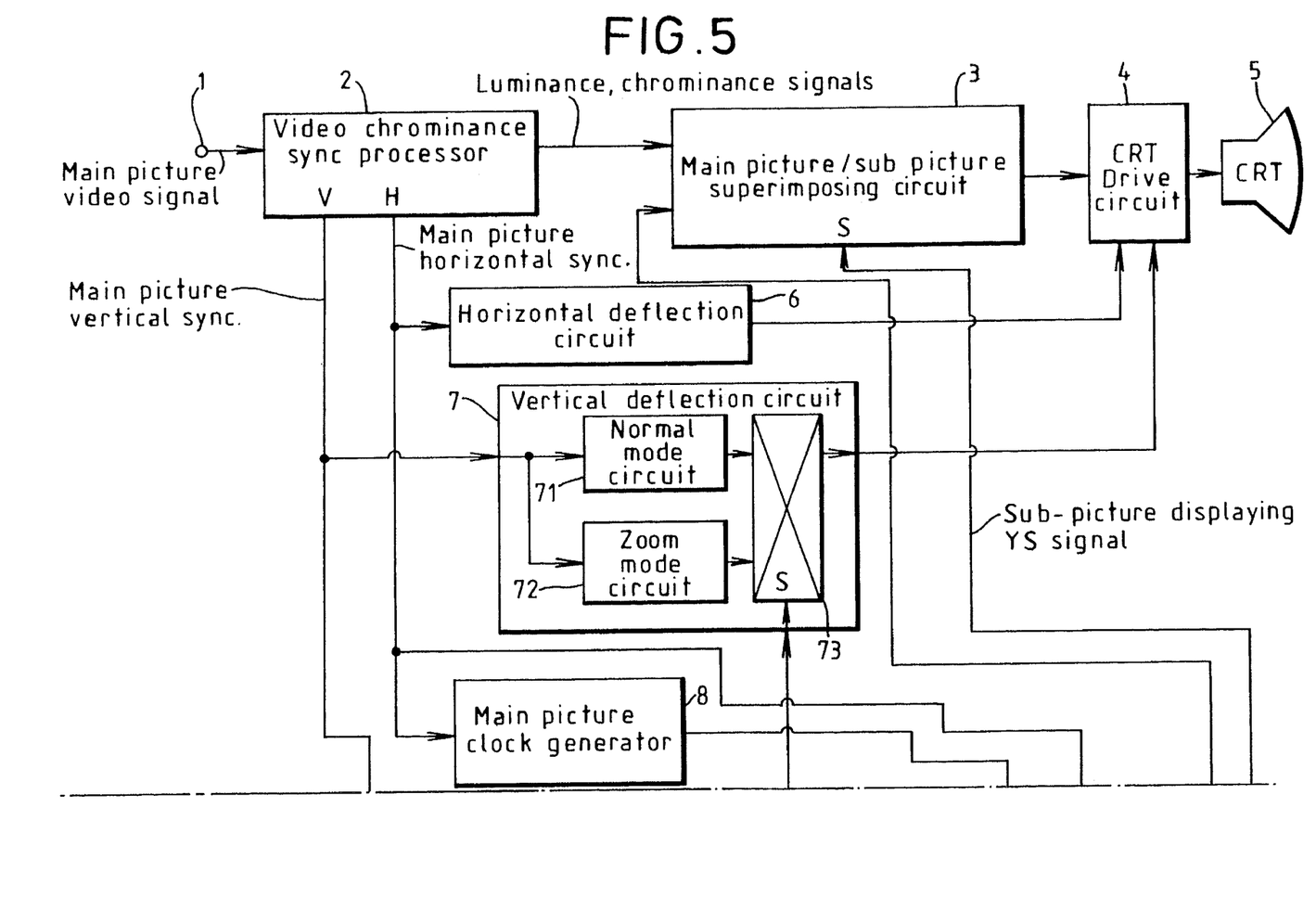
FIG. 5 is a block diagram showing the television signal processing circuit according to one embodiment of the present invention.
Figure 6:
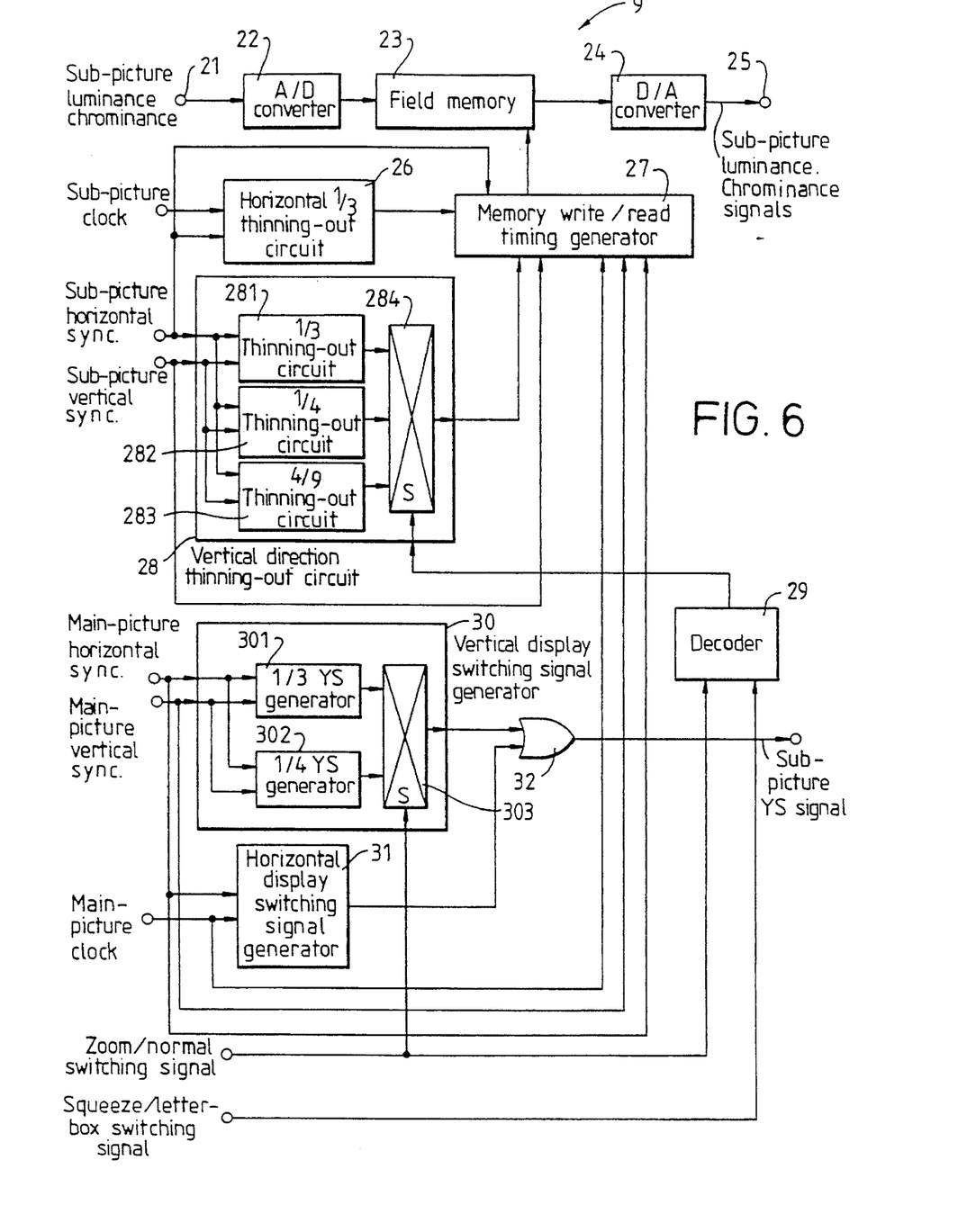
FIG. 6 is a block diagram showing the composition of the PIP processing circuit in FIG. 5.

Referring now to FIGS. 5 and 6, a preferred embodiment of the television signal processing circuit according to the present invention will be described in detail. FIG. 5 shows the full block diagram of the television signal processing circuit. FIG. 6 shows a block diagram showing the PIP processing circuit in FIG. 5, as described later in detail.

In FIG. 5, main-picture video signals on an input terminal 1 are supplied to a video chrominance sync processor 2, where main-picture horizontal sync signals, vertical sync signals, luminance and color difference signals are generated and output. The main-picture horizontal sync signals are input to a horizontal deflector 6, where horizontal drive pulses are generated and led to a CRT drive circuit 4. Further, the main-picture vertical sync signals are led to a normal mode circuit 71 and a zoom mode circuit 72 in a vertical deflector 7, where two types of normal mode and zoom mode vertical deflection pulses in different amplitudes are generated and output to the CRT drive circuit 4 at the next stage through a multiplexer 73. At the multiplexer 73, the normal mode and the zoom are switched by a switching signal from a microcomputer 13 and applicable vertical deflection pulses are output. Further, the main-picture horizontal and the vertical sync signals are input to a PIP processing circuit 9. The main-picture horizontal sync signals are also input to a main-picture clock generator 8, where a main picture clock locked with the main-picture horizontal sync signals is generated and input to the PIP processing circuit 9, from where it is fed to a sub-picture display switching signal (Ys) generator in the PIP processing circuit 9.

On the other hand, MUSE signals supplied from a BS tuner (not shown) are applied to a MUSE-NTSC converter 10. The MUSE-NTSC converter 10, composed of a squeeze mode circuit 101, a letter-box mode circuit 102 and a multiplexer 103, generates two sub-picture video signals in the squeeze mode and the letter-box mode and outputs them through the multiplexer 103. The video signals in the squeeze mode or the letter-box mode are selected by a squeeze/letter-box switching signal from the microcomputer 13 in the multiplexer 103 and outputs from the multiplexer 103. The sub-picture video signals are input to a video chrominance sync processor 11, where sub-picture horizontal sync signals, vertical sync signals and luminance/color difference signals are generated and output. These signals are then input to the PIP processing circuit 9. The sub-picture horizontal sync signals from the video chrominance sync processor 11 are input to a sub-picture clock generator 12, where sub-picture clock locked to the sub-picture horizontal sync signals are generated and input to the PIP processing circuit 9.

The main-picture luminance/color difference signals from the video chrominance sync processor 2 and the sub-picture luminance and chrominance signals from the PIP processing circuit 9 are led to a main-picture/sub-picture superimposing circuit 3, where the sub-picture is superimposed on the main-picture by the sub-picture display switching signal (Ys) and output to the CRT drive circuit 4. The luminance and chrominance signals are converted to the three primary colors in the CRT drive circuit 4 and output to a CRT 5.

FIG. 6 is a block diagram showing the detail of the PIP processing circuit 9. As shown in FIG. 6, the sub-picture luminance and chrominance signals are input through an input terminal 21 and then led to an A/D converter 22. Digitized luminance and chrominance signals output from the A/D converter 22 are temporarily stored in a field memory 23, and then restored to analog signals by a D/A converter 24. The analog signals ate then output from an output terminal 25 as PIP processed luminance and chrominance signals.

The sub-picture horizontal sync signals and the sub-picture clock are led to a horizontal 1/3 thinning-out circuit 26. Thus in the circuit 26 horizontal direction thinning-out timing signal are generated for thinning out in the horizontal direction at a 1/3 ratio for all of the pixels in the horizontal direction and are then input to a memory write/read timing generator 27. The sub-picture horizontal and vertical sync signals are input to a vertical direction thinning-out circuit 28. Furthermore in the circuit 28 the signals are parallelly applied to 1/3, 1/4 and 4/9 thinning-out circuits 281, 282 and 283, respectively, in order to thin out the vertical scanning lines at the ratio of 1/3, 1/4 or 4/9. Thinning-out processed signals from the 1/3, 1/4 and 4/9 thinning-out circuits 281,282 and 283 are selected by a selector 284 and output from a vertical direction thinning-out circuit 28. The signals are then input to the memory write/read timing generator 27 as vertical direction thinning-out timing signals. The selector 284 operates the selection of the thinning-out processed signals under the control of a decoder 29 which combines the zoom/normal switching signal and the squeeze/letter-box switching signal which are output from the microcomputer 13 (see FIG. 5). Then, the main-picture horizontal and the vertical sync signals are input to a vertical display switching signal generator 30 and led to a (1/3)Ys generator 301 and a (1/4)Ys generator 302. The output from the (1/3)Ys generator 301 and that from the (1/4)Ys generator 302 are led to a multiplexer 303, from which a vertical display switching signal (Ys) selected by the zoom/normal switching signal is output. The output from the vertical display switching signal generator 30 and that from the horizontal display switching signal generator 31 are input to an OR circuit 32 where they are combined and output as a sub-picture display switching signal.

The thinning-out ratios (1/3, 1/4, 4/9) of the vertical direction thinning-out circuit 28 and the switching signal (Ys) display range ratios (1/3, 1/4) of the vertical display switching signal generator 30 are selected by the combination of the zoom/normal modes and the squeeze/letter-box modes. Thus, sub-picture displays with equal size and the 16:9 aspect-ratio with 100% circularity can be achieved in all combinations of the four modes.

Table I shows the horizontal (H) and the vertical (V) direction thinning-out ratios and the display range ratios of the horizontal (H) and the vertical (V) display switching signals (Ys) according to the these mode combinations.

TABLE I

|  | Main-Picture Normal Mode | | | | Main-Picture Squeeze Mode | | | |
| --- | --- | --- | --- | --- | --- | --- | --- | --- |
|  | Thinning | | Display Ys | | Thinning | | Display Ys | |
|  | H | V | H | V | H | V | H | V |
| Sub-Picture Squeeze Mode | 1/3 | 1/3 | 1/3 | 1/3 | 1/3 | 1/4 | 1/3 | 1/4 |
| Sub-Picture Letter-Box Mode | 1/3 | 4/9 | 1/3 | 1/3 | 1/3 | 1/3 | 1/3 | 1/4 |

Figure 7A:
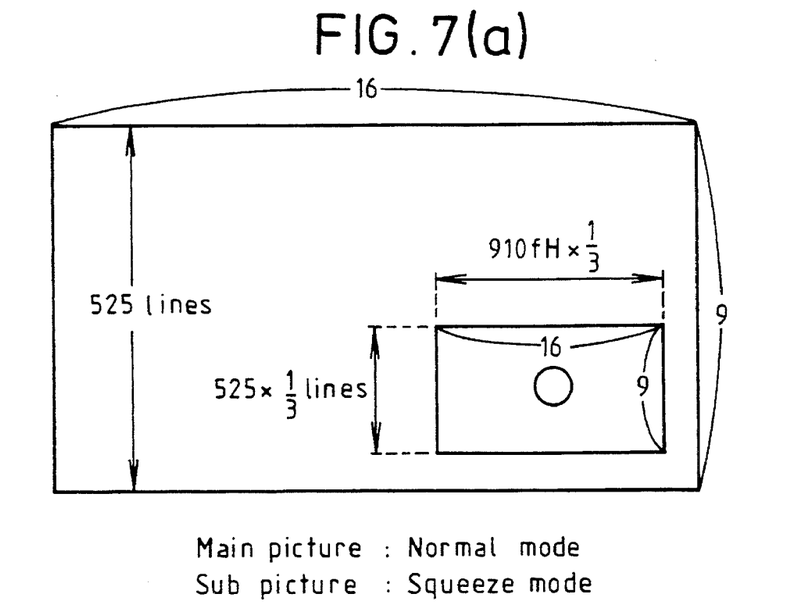

For example, in the case as shown in FIG. 7(a), while the sub-picture horizontal direction thinning-out ratio is 1/3 when the main-picture is in the normal mode, (1/3)Ys for displaying 1/3 of 525 scanning lines is selected for the vertical direction thinning-out display switching signal (Display Ys). With this combination, a sub-picture display with 100% circularity and the 16:9 aspect-ratio is achieved.

Figure 7B:
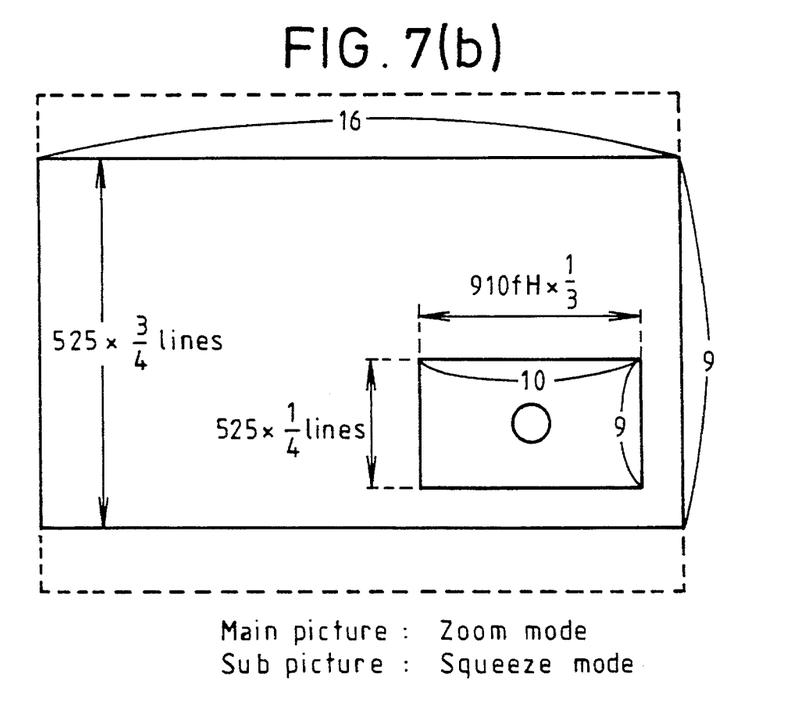

In the case as shown in FIG. 7(b), as the main-picture is in the zoom mode and the scanning lines displayed are 525×(¾) lines, (¾)×(⅓)=¼ is selected for the vertical direction thinning-out ratio when the sub-picture horizontal direction thinning-out ratio is ⅓. As the display Ys is also displayed in the same scanning lines, the sub-picture of the 16:9 aspect-ratio and the 100% circularity is achieved by selecting (¼)Ys.

Figure 7C:
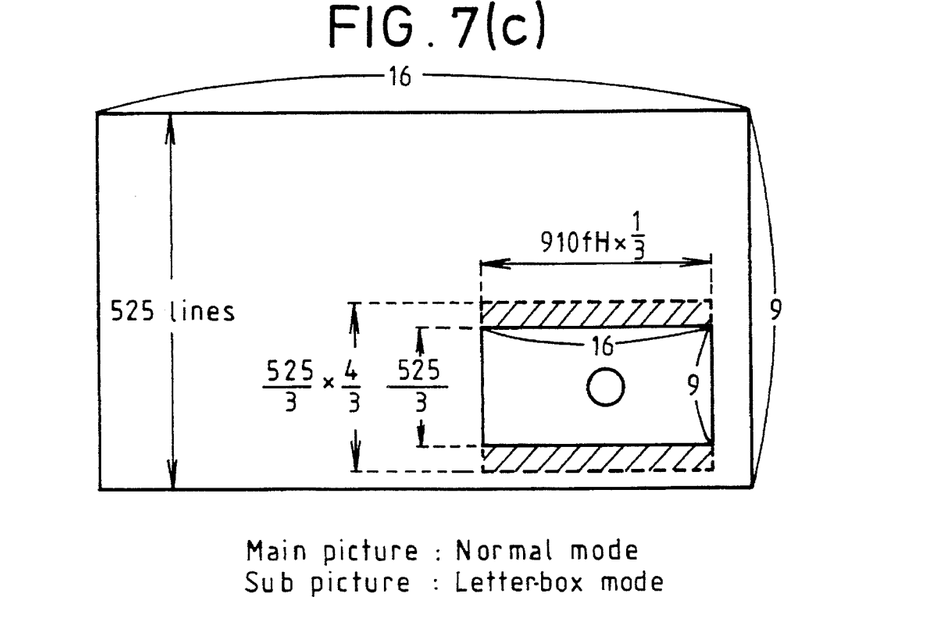

In the case as shown in FIG. 7(c), as the main-picture is in the normal mode and the sub-picture is in the letter-box mode having about 25% blank space, it is satisfactory if about 75% space other than the blank space is displayed in the 525×(⅓) scanning lines. Therefore, the vertical direction thinning-out ratio to display a sub-picture in the letter-box mode will be (⅔)×(⅓)=2/9. Further, as the vertical direction thinning-out display switching signal (Display Ys) does not display the blank space, if (⅓)Ys is selected, a sub-picture is displayed at the 16:9 aspect-ratio and the 100% circularity.

Figure 7D:
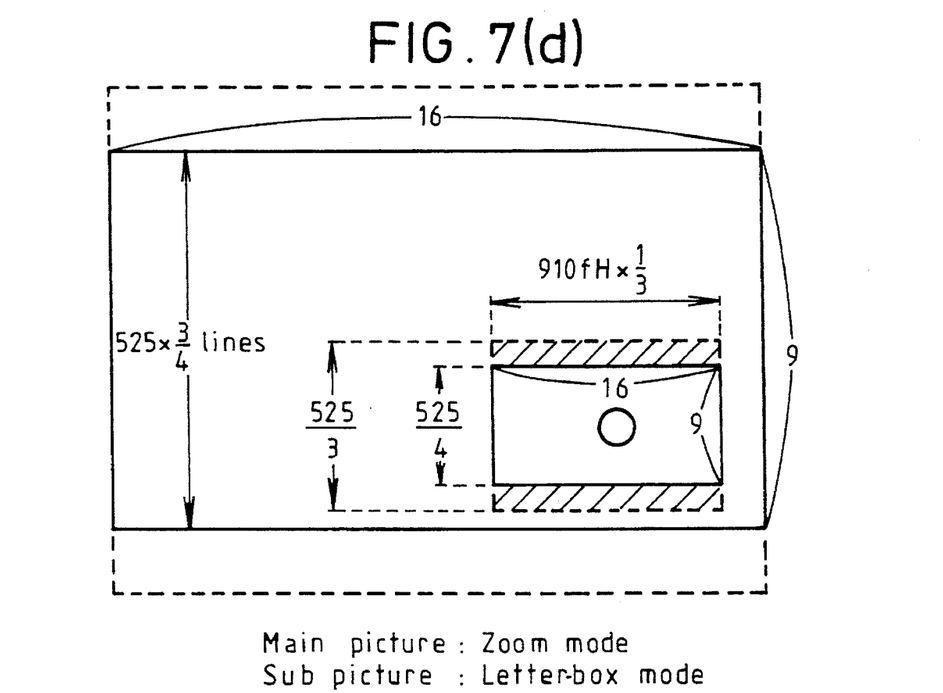

In the case as shown in FIG. 7(d), as the main-picture is in the zoom mode and the scanning lines are 525×(¾) lines, the display scanning lines of a sub-picture is 525×(¾)×(⅓)= 525×(¼) lines and the pattern portion other than the bank space in a sub-picture in the letter-box mode is ¾ of the entire space, the vertical direction thinning-out ratio of the sub-picture is (¼)×(⁴⁄₃)=⅓ and the scanning lines for the pattern portion become (⅓)×(¾)=¼.

The vertical direction thinning-out display switching signal (Display Ys) selects (¼)Ys to display the pattern portion only. Thus, a sub-picture is displayed at the 16:9 aspect-ratio and the 100% circularity. Further, for the vertical direction thinning-out, the horizontal sampling frequency fS of a sub-picture is set at fS=910 fH (fH is the horizontal scanning frequency) and the horizontal amplitude of a sub-picture is set at (910 fH)×(⅓).

As described above, by selecting the vertical direction thinning-out ratio and the display Ys by every mode of a main-picture and a sub-picture, it is possible to display a sub-picture in the equal size at the 16:9 aspect-ratio and the 100% circularity, in all of the combinations of the four modes.

Consequently, the present invention is able to display a sub-picture in the same size at a prescribed aspect-ratio and the 100% circularity and an easy to see PIP display image in any combination of the main-picture mode and the sub-picture mode.

As described above, the present invention can provide an extremely preferable television signal processing circuit.

While there have been illustrated and described what are at present considered to be preferred embodiments of the present invention, it will be understood by those skilled in the art that various changes and modifications may be made, and equivalents may be substituted for elements thereof without departing from the true scope of the present invention. In addition, many modifications may be made to adapt a particular situation or material to the teaching of the present invention without departing from the central scope thereof. Therefore, it is intended that the present invention not be limited to the particular embodiment disclosed as the best mode contemplated for carrying out the present invention, but that the present invention include all embodiments falling within the scope of the appended claims.

What is claimed is:

1. A television signal processing circuit comprising:
   a display device having a screen with an aspect-ratio of m1:n1, m1 being less than n1;
   means for displaying a main-picture, originating from a first television signal, on the display device;
   means for superimposing a sub-picture, originating from a second television signal, with a size smaller than that of the main-picture and the NTSC standard aspect-ratio close to the aspect-ratio of m1:n1, on a part of the main-picture by thinning out the scanning lines of the second television signal;
   means for selecting a display mode of the main-picture, said display mode being at least one of a normal display mode having a first number of scanning lines and a first vertical amplitude, and a zoom display mode having a second number of scanning lines that is less than the first number of scanning lines and an expanded vertical amplitude, said expanded vertical amplitude being larger than the first vertical amplitude; and
   means, responsive to the selecting means, for thinning out the scanning lines of the sub-picture and displaying the sub-picture having at least one of an aspect-ratio of m2:n2, wherein m2 is less than n2, by thinning out the scanning lines of the sub-picture to 1/a1 when the main-picture is in the normal display mode, and aspect-ratio is substantially m2:n2 by thinning out the scanning lines to 1/a2, wherein a1 is less than a2, when the main-picture is in the zoom display mode.

2. A television signal processing circuit as claimed in claim 1, wherein the aspect-ratio m1:n1 and the aspect-ratio m2:n2 are both 9:16, and the second number of scanning lines is N1×(¾) when the first number of scanning lines is N1, and the a1 and a2 are 3 and 4, respectively.

3. A television signal processing circuit comprising:
   a display device having a screen with an aspect-ratio of m1:n1, ml being less than n1;
   means for displaying a main-picture, originating from a first television signal, on the display device;
   means for superimposing a sub-picture, originating from a second television signal, having an aspect-ratio of m2:n2, wherein m2<n2 and m1/n1<m2/n2, at a size smaller than the main-picture on a part of the main-picture by thinning out the scanning lines of the second television signal, the sub-picture comprises an image signal section with an aspect-ratio of m1:n1, a first non-image signal section adjacent to the top of the image signal section and a second non-image signal section adjacent to the bottom of the image signal section;
   means for selecting a display mode of the main-picture being at least one of a normal display mode having a first number of scanning lines and a first vertical amplitude, and a zoom display mode having a second number of scanning lines that is less than the first number of scanning lines, and having an expanded vertical amplitude, said expanded vertical amplitude being larger than said first vertical amplitude; and
   means, responsive to the selecting means, for thinning out the scanning lines of the sub-picture and displaying the sub-picture with an aspect-ratio being at least one of substantially close to the aspect-ratio of m1:n1 by thinning out the scanning lines of the sub-picture to 1/a1 and eliminating the first non-image signal section and the second non-image signal section when the main-picture is in the normal display mode, and substantially close to the aspect-ratio of m1:n1 by thinning out the scanning lines of the sub-picture to 1/a2, wherein a2 is greater than a1, and by eliminating the first non-image signal section and the second non-image signal section when the main-picture is in the zoom display mode.

4. A television signal processing circuit as claimed in claim 3, wherein the aspect-ratios m1:n1 and m2:n2 are 9:16 and 3:4, respectively, and the second number of scanning lines is N1×(¾) when the first number of scanning lines is N1, and the a1 and a2 are 3 and 4, respectively.

5. A television signal processing circuit comprising:

a display device having a screen with an aspect ratio of m1:n1, m1 being less than n1;

means for displaying a main-picture, originating from a first television signal, on the display device;

means for superimposing a sub-picture, originating from a second television signal having an aspect-ratio of m2:n2, wherein m2<n2 and m1/n1<m2/n2, at a size smaller than the main-picture, on a part of the main-picture by thinning out the scanning lines of the second television signal, wherein the sub-picture comprises an image signal section having an aspect-ratio of m1:n1, a first non-image signal section adjacent to the top of the image signal section and a second non-image signal section adjacent to the bottom of the image signal section; and means for thinning out the scanning lines of the sub-picture and displaying the sub-picture in at least one of being with an aspect-ratio of m1:n1 by thinning out the scanning lines of the sub-picture to 1/a1, and being with an aspect-ratio of m1:n1 by eliminating the first non-image signal section and the second non-image signal section.

6. A television signal processing circuit as claimed in claim 5, wherein the aspect-ratios m1:n1 and m2:n2 are 9:16 and 3:4, respectively, and the a1 is 3.

7. A television signal processing circuit comprising:

a display device having a display screen with an aspect ratio of m1:n1, m1 being less than n1;

means for displaying a main-picture, originating from a first television signal, on the display device;

means for superimposing a sub-picture, originating from a second television signal, having an aspect-ratio of m2:n2, wherein m2<n2 and m1/n1<m2/n2, at a size smaller than the main picture, on a part of the main-picture by thinning out the scanning lines of the second television signals, the sub-picture is comprised of an image signal section having an aspect-ratio of m1:n1, a first non-image signal section adjacent to the top of the image section and a second non-image signal section adjacent to the bottom of the image signal section;

means for selecting the display mode of the main-picture between at least one of a normal display mode having a first number of scanning lines and a first vertical amplitude and a zoom display mode having a second number of scanning lines being less than the first number of scanning lines and an expanded vertical amplitude, the expanded vertical amplitude being larger than the first vertical amplitude; and means, responsive to the selecting means, for thinning out the scanning lines of the sub-picture and displaying the sub-picture having at least one of an aspect-ratio of m1:n1 by thinning out the scanning lines of the sub-picture to 1/a1 when in normal display mode, and having the first non-image signal section and the second non-image signal section eliminated when in the zoom display mode.

8. A television signal processing circuit as claimed in claim 7, wherein the aspect-ratios m1:n1 and m2:n2 are 9:16 and 3:4, respectively, and the second number of scanning lines is N1×(¾) when the first number of scanning line is N1, and the a1 is 4.

* * * * *